US011177144B2

(12) United States Patent
Lau et al.

(10) Patent No.: US 11,177,144 B2
(45) Date of Patent: Nov. 16, 2021

(54) WAFER SPOT HEATING WITH BEAM WIDTH MODULATION

(71) Applicant: Applied Materials, Inc., Santa Clara, CA (US)

(72) Inventors: Shu-Kwan Lau, Sunnyvale, CA (US); Zhiyuan Ye, San Jose, CA (US); Zuoming Zhu, Sunnyvale, CA (US); Koji Nakanishi, Taito-Ku (JP); Toshiyuki Nakagawa, Narita (JP); Nyi O. Myo, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 256 days.

(21) Appl. No.: 16/407,670

(22) Filed: May 9, 2019

(65) Prior Publication Data
US 2019/0371631 A1 Dec. 5, 2019

Related U.S. Application Data

(60) Provisional application No. 62/680,278, filed on Jun. 4, 2018.

(51) Int. Cl.
H05B 3/68 (2006.01)
H01L 21/67 (2006.01)
(Continued)

(52) U.S. Cl.
CPC .... H01L 21/67115 (2013.01); B23K 26/0648 (2013.01); B23K 26/073 (2013.01); H01L 21/67248 (2013.01)

(58) Field of Classification Search
CPC ............ B23K 2101/40; B23K 2103/56; B23K 26/03; B23K 26/034; B23K 26/0608;
(Continued)

(56) References Cited

U.S. PATENT DOCUMENTS 6,478,480 B1\* 11/2002 Sasaki .................... B23K 26/22
219/121.64
2003/0196995 A1\* 10/2003 Jennings ............ B23K 26/0665
219/121.73
(Continued)

FOREIGN PATENT DOCUMENTS

JP 2016-001642 A 1/2016

OTHER PUBLICATIONS

PCT Notification of Transmittal of the International Search Report and the Written Opinion of the International Searching Authority for International Application No. PCT/US2019/032301; dated Sep. 26, 2019; 11 total pages.

Primary Examiner — Sang Y Paik
(74) Attorney, Agent, or Firm — Patterson + Sheridan LLP

(57) ABSTRACT

Embodiments of the present disclosure provide a thermal process chamber that includes a substrate support, a first plurality of heating elements disposed over or below the substrate support, and a spot heating module disposed over the substrate support. The spot heating module is utilized to provide local heating of regions on a substrate disposed on the substrate support during processing. Localized heating of the substrate alters temperature profile. The shape of the beam spot produced by the spot heating module can be modified without making changes to the optics of the spot heating module.

20 Claims, 8 Drawing Sheets

(51) Int. Cl.
*B23K 26/06* (2014.01)
*B23K 26/073* (2006.01)

(58) Field of Classification Search
CPC ............ B23K 26/0622; B23K 26/0648; B23K 26/073; B23K 26/0823; B23K 26/126; B23K 26/127; H01L 21/67115; H01L 21/67248
USPC ...................... 219/443.1–444.1; 392/316–318
See application file for complete search history.

(56) References Cited

U.S. PATENT DOCUMENTS

| | | |
|---|---|---|
| 2012/0252229 A1 | 10/2012 | Timans |
| 2013/0248504 A1 | 9/2013 | Kusuda |
| 2015/0064933 A1 | 3/2015 | Sharma et al. |
| 2017/0103907 A1 | 4/2017 | Chu et al. |

\* cited by examiner

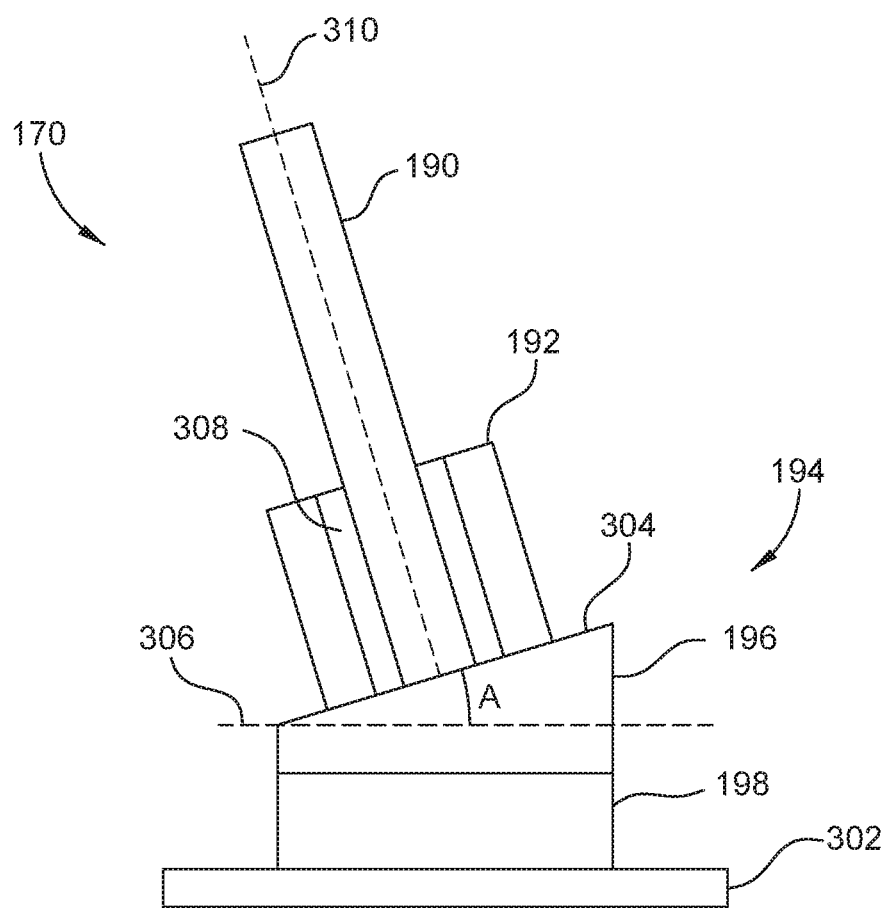

WAFER SPOT HEATING WITH BEAM WIDTH MODULATION

CROSS-REFERENCE TO RELATED APPLICATIONS

This application claims priority to U.S. Provisional Patent Application Ser. No. 62/680,278, filed on Jun. 4, 2018, which herein is incorporated by reference.

BACKGROUND

Field

Embodiments of the present disclosure relate to apparatus and methods for semiconductor substrate processing, more particularly, to a thermal process chamber with a spot heating module useful for semiconductor substrate processing.

Description of the Related Art

Semiconductor substrates are processed for a wide variety of applications, including the fabrication of integrated circuit devices and microdevices. In one class of processes, a substrate is commonly positioned on a susceptor within a process chamber. The susceptor is supported by a support shaft, which is rotatable about a central axis to rotate the susceptor coupled at one end thereof. Precise control of a heating source, such as a plurality of heating lamps disposed below and above the substrate, allows the substrate to be heated during processing thereof.

The temperature of the substrate, and the uniformity of the substrate temperature during processing, can affect the thickness uniformity of the material deposited on the substrate. The non-uniformity of the substrate temperature may be axially symmetric or axially asymmetric. The axially symmetric non-uniformities of the substrate temperature can be reduced by zoned control of the heating source as the susceptor rotates during processing. The axially asymmetric non-uniformities of the substrate temperature, e.g., those caused by structural non-uniformities of the susceptor or support shaft, e.g., lift pins, cannot be compensated by zoned control of the heating source because the sources of the non-uniformities rotate with the susceptor and the substrate.

Despite the precise control of the heat source used to heat the substrate, non-uniformity is observed in the result of deposition processes performed in many existing apparatus. Therefore, a need exists for ways to manage and reduce axially asymmetric temperature non-uniformities in a thermal semiconductor processing chamber.

SUMMARY

Embodiments of the present disclosure relate to apparatus and methods for semiconductor substrate processing, more particularly, to a thermal process chamber useful for semiconductor substrate processing. In one embodiment, a process chamber includes an enclosure, a substrate support disposed within the enclosure, an energy module disposed outside the enclosure facing the substrate support, a support disposed outside the enclosure, and a spot heating module disposed on the support. The spot heating module includes a holder, and a movement device coupled to the holder.

In another embodiment, a process chamber includes an enclosure, a substrate support disposed within the enclosure, an energy module disposed outside the enclosure facing the substrate support, and a spot heating module disposed outside the enclosure. The spot heating module includes a plurality of holders, and a plurality of movement devices, wherein each movement device of the plurality of movement devices is coupled to a corresponding holder of the plurality of holders.

In another embodiment, a process chamber includes an enclosure, a substrate support disposed within the enclosure, an energy module disposed outside the enclosure facing the substrate support, and a spot heating module disposed on the support. The spot heating module includes a stage, a holder disposed on the stage, a collimator disposed on the holder, and a movement device disposed between the holder and the collimator.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a schematic side view of a spot heater according to one embodiment.

Figure 1:
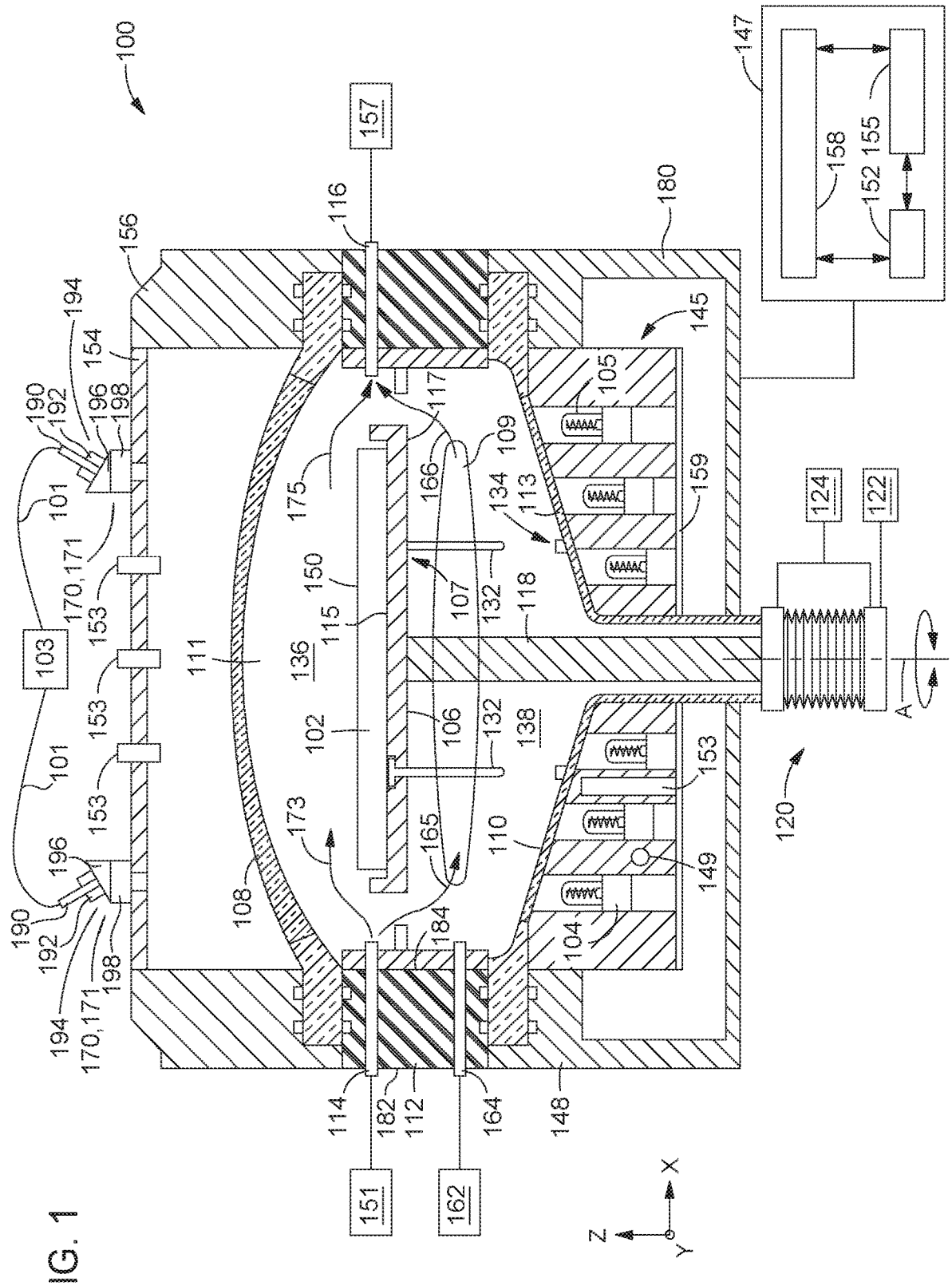
FIG. 1 is a schematic cross sectional side view of a process chamber according to one embodiment.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments of the present disclosure provide a thermal process chamber that includes a substrate support, a first plurality of heating elements disposed over, below, or over and below the substrate support, and a spot heating module disposed over the substrate support. The spot heating module is utilized to provide local heating of regions on a substrate disposed on the substrate support during processing. Localized heating of the substrate alters temperature profile, which in turn can be used to improve deposition uniformity. The shape of the beam spot produced by the spot heating module can be modified without making changes to the optics of the spot heating module.

A "substrate" or "substrate surface," as described herein, refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments herein are related to round 200 mm or 300 mm substrates, other shapes, such as polygonal, square, rectangular, curved, or otherwise non-circular workpieces may be utilized.

FIG. 1 illustrates a schematic sectional view of a process chamber 100 according to one embodiment. The process chamber 100 may be a deposition or a thermal treatment chamber, such as a vapor phase epitaxy chamber. A chamber such as the process chamber 100 can be used to perform other thermal processes, as well. The process chamber 100 may be used to process one or more substrates. A substrate 102 is disposed in the process chamber 100 for processing, which may include depositing a material on a device side 150 of the substrate 102, heating of the substrate 102, etching of the substrate 102, or combinations thereof. The process chamber 100 includes a spot heating module 171. The spot heating module 171 includes one or more spot heaters 170. The spot heating module 171 is utilized to heat one or more regions on the substrate 102 during processing. The one or more regions may be cold spots, for example where the lift pins 132 create non-uniform application of heat to the substrate 102. In one embodiment, the spot heaters 170 are connected to an electromagnetic radiant source 103 via corresponding optical fibers 101. A single electromagnetic radiant source 103 can be optically coupled to only one spot heater 170, or to more than one spot heater 170, by optical fibers 101. Multiple optical fibers 101 can connect one electromagnetic radiant source 103 to multiple spot heaters 170, as shown in FIG. 1. In some embodiments, the electromagnetic radiant source 103 is disposed directly on the spot heater 170 instead of coupled to the spot heater 170 by the optical fiber 101. The electromagnetic radiant source 103 may be a pulsing electromagnetic radiant source or a continuous wave (CW) electromagnetic radiant source.

The electromagnetic radiant sources 103 may be high-energy radiant sources, such as lasers. Examples of laser sources that may be used include crystal lasers, laser diodes and arrays, and VCSEL's. High intensity LED sources may also be used, and collimators may be used to collimate light emitted from the LED source to form a light beam. Wavelength of the emitted radiation may generally be in the ultraviolet, visible, and/or infrared spectrum, from about 200 nm to about 900 nm, for example 810 nm, and the emitted radiation may be monochromatic, narrow band, broadband, or ultra-broadband such as a white laser. The electromagnetic radiant sources 103 emit high intensity electromagnetic radiation, which is routed by the fibers 101 to the spot heaters 170. The spot heaters 170 orient the outlet end of the optical fibers 101 toward a target location in the process chamber 100, such as on the substrate 102 disposed on the susceptor 106. The optical fiber 101, so oriented, produces a radiant beam from the radiation emitted by the electromagnetic radiant source 103 toward the target location. The end of the optical fiber 101 can have one or more optical features, including lenses, faceted surfaces, diffuse surfaces, filters and other coatings, to direct or condition the electromagnetic radiation exiting the fiber. Alternately, one or more optical elements can be coupled to the end of the optical fiber 101 in the spot heater 170. The spot heater 170 is thus configurable and swappable. The radiant beams from the electromagnetic radiant sources 103 may have the same wavelength or different wavelengths. In one embodiment, the radiant beams have different wavelengths for heating different materials formed on the substrate 102.

As shown in FIG. 1, the spot heater 170 includes a collimator 190 held by a holder 192. The collimator 190 is an optical element that collimates radiation from one of the electromagnetic radiant sources 103, for example by use of appropriately designed lenses. The collimator 190 has a first end, into which radiation from the electromagnetic radiant source 103 is input, for example by directing the output of a laser source into an opening in the first end. The collimator 190 has a second end with an opening where a collimating optical assembly is housed. In some embodiments, a laser or laser source may be directly mounted to the collimator 190 by inserting a beam exit portion of the laser into the first end of the collimator 190 such that the radiation emitted by the laser passes through the collimator 190 and exits through the second end with the collimating optical assembly, which may be a lens or a collection of lenses.

In some embodiments, the collimator 190 is replaced with the fiber 101 or the electromagnetic radiant source 103, and the holder 192 holds the fiber 101 or the electromagnetic radiant source 103 directly. The holder 192 is disposed on the stage 194. The stage 194 includes a wedge 196 and a slider 198. The spot heater 170 will be described further below.

Figure 2:
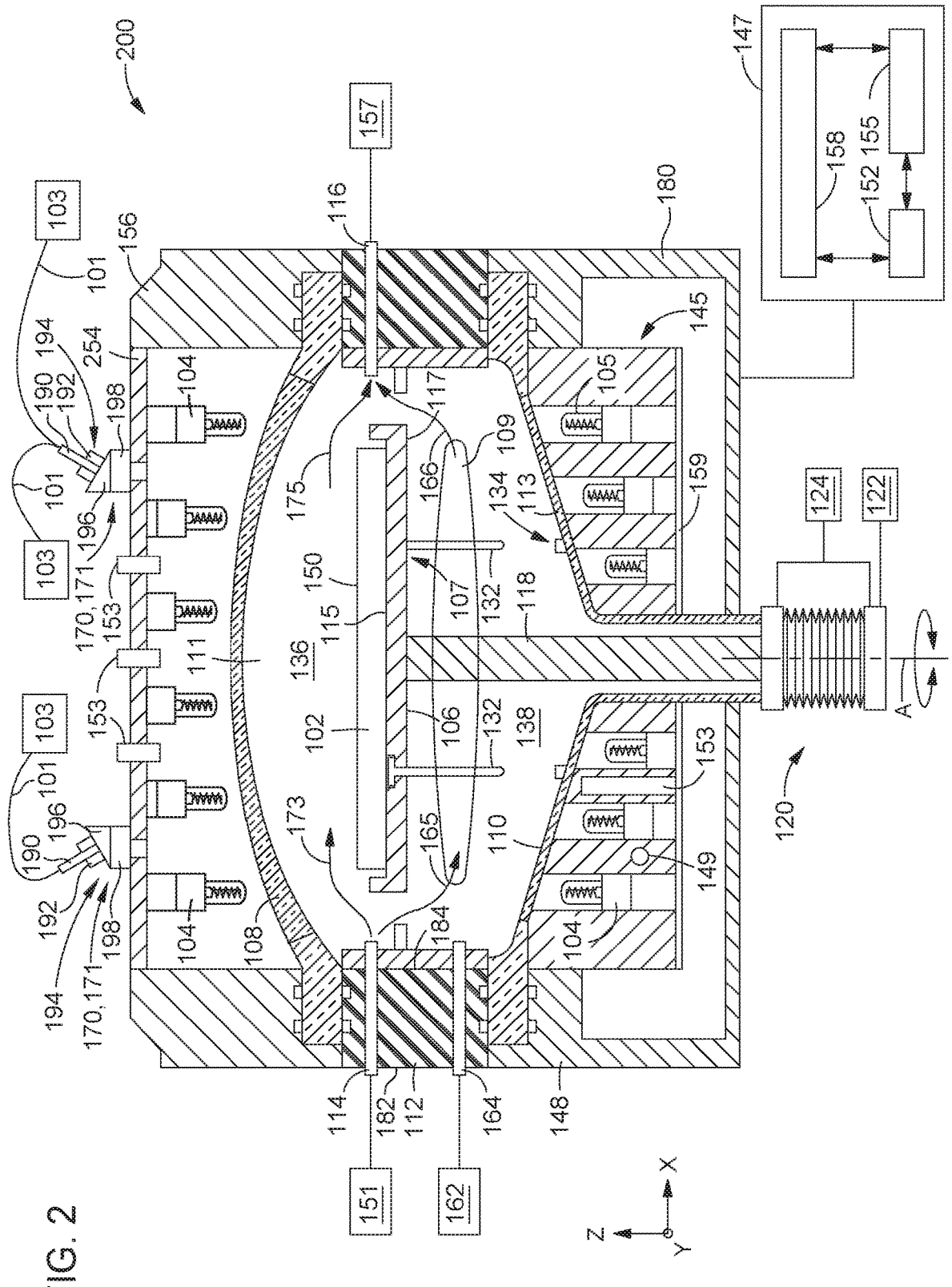
FIG. 2 is a schematic cross sectional side view of a process chamber according to another embodiment.

The process chamber 100 includes an enclosure 148 comprising a base 180 and a reflector 154 disposed over the base 180. The process chamber 100 further includes spacer 112 disposed on the base 180, a first shell 108 disposed on the spacer 112, a second shell 110 disposed on the base 180, a susceptor 106 disposed between the first shell 108 and the second shell 110, and an energy module 104 disposed within the process chamber 100. In this case, the energy module 104 is disposed within the base 180. The energy module 104 heats the susceptor 106 and/or the substrate 102 disposed on the susceptor 106. In one embodiment, the energy module 104 is an array of radiant heating lamps, as shown in FIG. 1. As shown in FIG. 1 and FIG. 2, the energy module 104 may be positioned below the second shell 110 to irradiate the susceptor 106, and the susceptor 106 is between the substrate 102 and the energy module 104. As shown in FIG. 2, an energy module 104 may be disposed on both sides of the susceptor 106 such that the susceptor 106 is between two energy modules 104. Although the energy module 104 of FIG. 1 is shown on one side of the susceptor 106 (i.e. below the susceptor 106), the energy module 104 could be disposed on the other side of the susceptor 106 from that shown in FIG. 2 (i.e. above the susceptor 106). The energy module 104 disposed over the first shell 108 is also positioned to irradiate the substrate 102.

Each energy module 104 may be independently controlled in zones, such as radial zones, in order to control the temperature of various regions of the substrate 102 as a process gas or vapor passes over the surface of the substrate 102, thus facilitating the deposition of a material onto a device side 150 of the substrate 102. Radial zonality allows some control of deposition thickness uniformity by adjusting local temperature at the reaction site to compensate for reactant concentration variation due to flow non-uniformities and edge-to-center reactant depletion. Zones are separately powered using separate power supplies or by power division control among the zones.

The substrate 102 is transferred into the process chamber 100 and positioned onto the susceptor 106 through a loading port 109 formed in the spacer 112. The susceptor 106 may be a disk-like substrate support as shown. In some embodiments, the susceptor 106 is replaced with a ring-like substrate support (not shown), which supports the substrate 102 from the edge of the substrate 102 to expose a backside of the substrate 102 directly to heat from the energy module 104 disposed below the second shell 110. The susceptor 106 may be fabricated from silicon carbide, silicon coated with silicon carbide, quartz coated with silicon carbide, or graphite coated with silicon carbide to absorb radiant energy from the energy module 104 and direct the radiant energy to the substrate 102, thus heating the substrate 102.

Although not shown, portions of the substrate 102 may be elevated above the susceptor 106, for example if the susceptor 106 has contact-reducing features. In such cases, the susceptor heats the substrate 102 by a combination of radiation and conduction. The proportion of radiant heating and conductive heating is determined by the fraction of the substrate area in direct contact with the susceptor surface. Distribution of the two different heating mechanisms can result in thermal non-uniformities that cannot be corrected by zoned control of the energy module 104.

The susceptor 106 is supported by a shaft or stem 118 that is coupled to a motion assembly 120. The motion assembly 120 includes a rotary actuator 122 that when in operation rotates the stem 118, which rotates the susceptor 106, about the longitudinal axis A of the process chamber 100 perpendicular to an X-Y plane of the process chamber 100. The motion assembly 120 also includes a linear actuator 124 to move the stem 118, which moves the susceptor 106, along the longitudinal axis A of the process chamber 100 in the Z direction (e.g. vertically) of the process chamber 100. The susceptor 106 is rotated about its center during processing using the rotary actuator 122 to minimize the effect of thermal and process gas flow spatial anomalies within the process chamber 100 and thus facilitates uniform processing of the substrate 102. The susceptor 106 rotates at a rate between about 5 RPM and about 100 RPM, such as between about 10 RPM and about 50 RPM, for example about 30 RPM.

The first shell 108 may be a dome, and the second shell 110 may also be a dome. The first shell 108 and the second shell 110 each transmit the radiant energy from the energy module 104. The first shell 108 and the second shell 110, along with the spacer 112 that is disposed between the first shell 108 and second shell 110, define an internal region 111 of the process chamber 100. Each of the first shell 108 and/or the second shell 110 may be flat, convex, or concave. In some embodiments, each of the first shell 108 and/or the second shell 110 is transparent to the radiation of the radiant energy emitted from the energy module 104 (transmitting at least 95% of the radiation of the radiant energy). In one embodiment, the first shell 108 and the second shell 110 are fabricated from quartz.

The energy module 104 provides a total radiant power output of between about 10KW and about 60KW, which can heat a semiconductor substrate to a temperature within a range of about 200 degrees Celsius to about 1,600 degrees Celsius. Each lamp 105 of the energy module 104 can be coupled to a power distribution board, such as printed circuit board (PCB) 159, through which power is supplied to each lamp 105. The PCB 159 can have power division control circuitry if one power supply supplies power to more than one heating zone. In one embodiment, the energy module 104 is positioned within a housing 145. The housing 145 has one or more channels 149 to flow a cooling fluid between the lamps 105.

In FIG. 1, the susceptor 106 is shown in an elevated processing position. The susceptor 106, while located in the processing position, divides the internal region 111 of the process chamber 100 into a process gas region 136 above the susceptor 106, and a purge gas region 138 below the susceptor 106. To load and unload substrates 102, the susceptor 106 is moved to a transfer position to allow lift pins 132 to contact standoffs 134 disposed on an interior surface 113 of the second shell 110. The stand-offs 134 are made of the same material as the second shell 110. The lift pins 132 are suspended in holes 107 formed through the susceptor 106. Each hole 107 extends from a substrate supporting surface 115 of the susceptor 106 to a back surface 117 of the susceptor 106 opposite the substrate supporting surface 115. Substrate temperature is determined using one or more thermal sensors 153 configured to sense thermal radiation emitted by the back surface 117 of the susceptor 106. The sensors 153 may be pyrometers disposed in ports formed in the housing 145. Additionally or alternatively, one or more thermal sensors 153, directly sense thermal radiation emitted by the device side 150 of the substrate 102. The sensors 153, or one or more controllers coupled to the sensors 153 to receive signals representing the sensed radiation, determine temperature from the sensed radiation. The reflector 154 is placed outside the first shell 108 to reflect radiation that is radiating off the substrate 102 and redirect the radiation back onto the substrate 102. In one embodiment, as shown in FIG. 2, an energy module 104 is coupled to the reflector 154. A clamp ring 156 disposed on the spacer 112 and the first shell 108 secures the reflector 154 over the first shell 108. The reflector 154 can be made of a metal such as aluminum or stainless steel. The sensors 153 can be disposed through the reflector 154 to receive radiation from the device side 150 of the substrate 102.

Process gas supplied from a process gas supply source 151 is introduced into the process gas region 136 through the process gas inlet 114 formed in the spacer 112. The spacer 112 has an outer surface 182 and an inner surface 184. The process gas inlet 114 directs the process gas across the device side 150 of the substrate 102. The processing position of the susceptor 106 and the substrate 102 thereon, are adjacent to the process gas inlet 114, thus allowing the process gas to flow generally along flow path 173 across the device side 150 of the substrate 102. The process gas exits the process gas region 136 (along flow path 175) through the gas outlet 116 located in the spacer 112 opposite from the process gas inlet 114. The gas outlet 116 is an opening formed in the spacer 112 fluidly coupling a vacuum pump 157 to the process gas region 136. Removal of the process gas through the gas outlet 116 is facilitated by the vacuum pump 157 coupled thereto.

Purge gas supplied from a purge gas source 162 is introduced to the purge gas region 138 through a purge gas inlet 164 formed in the spacer 112. During a film formation process, the susceptor 106 is located at a position such that the purge gas flows generally along flow path 165 across the back surface 117 of the susceptor 106. The purge gas exits the purge gas region 138 (along flow path 166) and is exhausted out of the process chamber 100 through the gas outlet 116.

The above-described process chamber 100 can be controlled by a processor based system controller, such as controller 147, shown in FIGS. 1 and 2. For example, the controller 147 is configured to control flow of various precursor and process gases and purge gases from gas sources, during different operations of a substrate processing sequence. The controller 147 can be configured to control activation of the spot heating module 171, predict an algorithm for activating the spot heating module 171, and/or synchronize the operation of the spot heating module 171 with substrate rotation, feeding of gases, lamp operation, or other process parameters, among other controller operations. The controller 147 includes a programmable central processing unit (CPU) 152 that is operable with a memory 155 and a mass storage device, an input control unit, and a display unit (not shown), such as clocks, cache, input/output (I/O) circuits, and the like, coupled to the various components of the process chamber 100 to facilitate control of substrate processing in the process chamber 100. The controller 147 further includes support circuits 158. To facilitate control of the process chamber 100 described above, the CPU 152 may be one of any form of general purpose computer processor that can be used in an industrial setting, such as a programmable logic controller (PLC), for controlling various chambers and sub-processors. The memory 155 is in the form of computer-readable storage media that contains instructions, that when executed by the CPU 152, facilitates the operation of the process chamber 100. The instructions in the memory 155 are in the form of a program product such as a program that implements the method of the present disclosure.

FIG. 2 illustrates a schematic sectional view of a process chamber 200 according to one embodiment. The process chamber 200 is similar in some respects to the process chamber 100 shown in FIG. 1. The process chamber 200 has a reflector 254 with an energy module 104 integrated therein. The process chamber 200 includes the enclosure 148 comprising the base 180 and a reflector 254 disposed over the base 180. The spot heating module 171 is disposed on the reflector 254. As shown in FIG. 2, one optical fiber 101 can connect one electromagnetic radiant source 103 to one spot heater 170, or more than one electromagnetic radiant source 103 can be connected to one spot heater 170 using optical fibers 101.

FIG. 3 is a schematic side view of the spot heater 170 according to one embodiment. As shown in FIG. 3, the spot heater 170 includes the collimator 190 held by the holder 192. The collimator 190 may be a tubular member containing optical elements such as lenses, and the holder 192 may be a cylindrical object with a central opening to receive and secure the tubular collimator 190 in a desired location. The holder 192 is disposed on the stage 194, and the stage 194 is disposed on a support 302. The stage 194 includes the wedge 196 and the slider 198. The slider 198 is linearly movable on the support 302 using set screws or an actuator. The slider 198 can include an actuator that can move the slider 198 during processing. The wedge 196 includes a surface 304 that is in contact with the holder 192, and the surface 304 forms an angle A with respect to a plane 306 that is substantially parallel to a major surface of the susceptor, such as the susceptor 106 of the process chamber 100 shown in FIGS. 1 and 2.

The angle A of the wedge 196 can be adjusted by an actuator located in the wedge 196. Targeting of the spot heater 170 can be accomplished by selecting the angle A of the wedge 196 and by adjusting the location of the slider 198. Because the angle A of the wedge 196 and the location of the slider 198 can be adjusted by actuators, the location of the beam spot on the substrate, such as the substrate 102 shown in FIG. 1, can be adjusted during processing. The wedge 196, the slider 198, and the support 302 may be fabricated from a material that is transparent to the radiation of the radiant energy emitted from the electromagnetic radiant source 103 (transmitting at least 95% of the radiation of the radiant energy). In one embodiment, the wedge 196, the slider 198, and the support 302 are fabricated from quartz. In some embodiments, an opening is formed through the wedge 196, the slider 198, and the support 302 for a beam, such as a laser beam, from the collimator 190 to pass through the wedge 196, the slider 198, and the support 302 to a target area on the substrate 102. The opening may be large enough to accommodate the movement of the surface 304 of the wedge 196 or the slider 198. The opening formed in the support 302 may be at least larger than openings formed in the wedge 196 and the slider 198, so the openings formed in the wedge 196 and the slider 198 are not occluded by any portion of the support 302. In one embodiment, the opening formed in the support 302 is larger than the opening in the slider 198, regardless of the position of the slider 198. In cases where the wedge 196 has an opening, the opening will be aligned with an optical axis of the radiation source (i.e. the optical fiber 101) delivering radiation inside the collimator 190, and will be sized to admit all, or a desired portion, of the radiation through the opening.

The spot heater 170 can be aimed by performing a manual alignment process. During the alignment process, any components between the support 302 and the susceptor 106 may be removed to facilitate manual alignment of the spot heater 170. The spot heater 170 is energized to produce a guide beam, so an operator can view a spot of light from the guide beam landing on the susceptor. The susceptor may be rotated so the region to be heated by the spot heater 170 is readily lighted by the guide beam. The positioning devices, such as the slider 198 and the wedge 196 of the stage 194, can then be operated to align the spot heater 170 to a region to be heated. In one embodiment, the regions to be heated are where the lift pins, such as the lift pins 132 of the process chamber 100 shown in FIG. 1, are located. The guide beam may be produced by a lower intensity laser directly coupled, or fiber-coupled, to the spot heater 170.

A movement device 308 is coupled to the collimator 190 to facilitate movement of the collimator 190. The movement device 308 is disposed between the holder 192 and the collimator 190. One or more bearings may be disposed between the movement device 308 and the holder 192 to minimize friction between the movement device 308 and the holder 192. In one embodiment, the movement device 308 is a device that can rotate the collimator 190 with respect to the longitudinal axis 310 of the collimator 190. The collimator 190 may be at a first position during the processing of the substrate using a first process recipe, and the collimator 190 may be rotated to a second position before processing the substrate using a second process recipe. Rotating of the collimator 190 may change the shape and/or size of the beam spot of a radiant beam exiting the collimator 190.

In one embodiment, the movement device 308 continuously rotates the collimator 190 in one direction, clockwise or counterclockwise, with respect to the longitudinal axis 310 of the collimator 190 during processing to dynamically change the shape of the beam spot on the substrate. The substrate may also be rotated during processing. The rotation of the collimator 190 may be synchronized with the rotation of the substrate in order to provide precise heating of one or more cold spots on the substrate. In another embodiment, the movement device 308 causes the collimator 190 to rotationally oscillate within a predetermined angular range, such as between negative 60 degrees to 60 degrees. The oscillation of the collimator 190 may be synchronized with the rotation of the substrate. In some embodiments, the collimator 190 is replaced with the fiber 101 or the electromagnetic radiant source 103 (FIG. 1). The movement device 308 is coupled to the fiber 101 or the electromagnetic radiant source 103 (FIG. 1) that is held by the holder 192, and the movement device 308 rotates the fiber 101 or the electromagnetic radiant source 103 the same way as the collimator 190.

The movement device 308 can be a controlled motion device that produces a periodic motion, such as vibration, circular motion, or linear motion. The motion produced by the movement device 308 is transferred to the collimator 190, or alternately, the fiber 101 or the electromagnetic radiation source 103 (FIG. 1). The collimator 190 may move the beam spot as the motion transferred from the movement device 308 moves the collimator 190, and the movement of the beam spot irradiates an exposure area that is larger than an area of the beam spot. In another embodiment, the collimator 190 irradiates overlapping regions on the substrate, approximating irradiation by a large beam spot larger than the beam spot produced by the electromagnetic radiant source 103 (FIG. 1). When the collimator 190 moves, the electromagnetic radiant source produces a continuous electromagnetic radiant beam that irradiates an exposure area on the substrate larger than an area of the beam spot as the electromagnetic radiant beam passes through the moving collimator 190. The large beam spot defines an annular heating zone as the substrate rotates.

The electromagnetic radiant source 103 may be pulsed through the moving collimator 190 to form a large beam spot on the substrate as the electromagnetic radiant beam passes through the moving collimator 190. The large beam spot heats discrete areas on the substrate as the substrate rotates. The pulsing of the electromagnetic radiant beam may be synchronized with the rotation of the substrate and/or with movement of the beam spot. For example, pulsing of the beam may be set to a frequency related to a frequency of vibration of the collimator 190. The related frequencies may deliver radiation pulses to overlapping areas of the substrate such that an exposure area of the substrate, larger than an area of any of the pulses, is exposed to pulsed radiation. Duration of the pulsing through the moving collimator 190 determines an angular sweep of the exposure along an annular, or partially annular, heating zone.

The collimator 190 may move continuously or periodically, such as when a pulse of the electromagnetic radiant beam passes through the collimator 190. In one example, the beam may be pulsed for a first duration while the collimator 190 moves, and a second duration while the collimator 190 does not move. In such an embodiment, a first exposure area of the substrate corresponding to the first duration is larger than an area of the beam, while a second exposure area corresponding to the second duration has a dimension that is the same as a dimension of the beam.

Figure 4A:
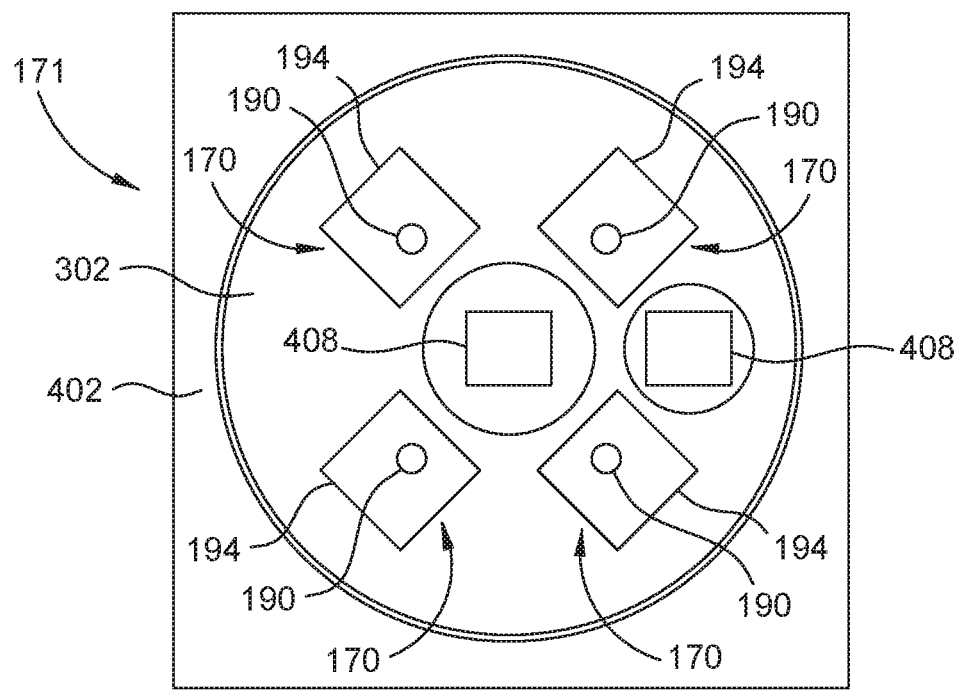
FIGS. 4A-4B are schematic top views of a spot heating module according to one embodiment.
Figure 4B:
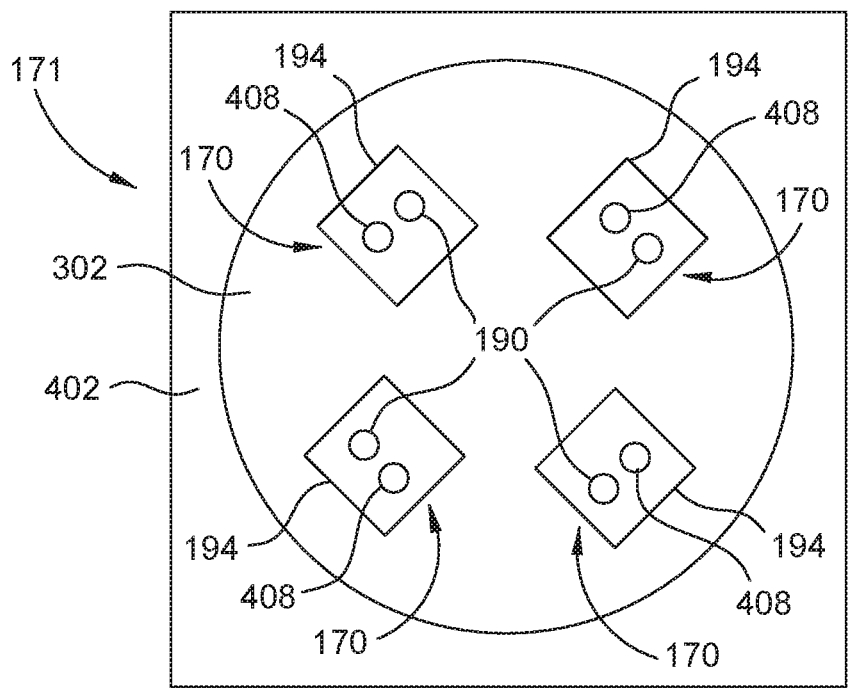

FIGS. 4A-4B are schematic top views of a spot heating module 171, according to one embodiment. As shown in FIG. 4A, the spot heating module 171 includes one or more spot heaters 170. The one or more spot heaters 170 are disposed on the support 302 that is integrated into or on a chamber cover 402. The chamber cover 402 may be the reflector 154 or 254 of the process chamber 100 or 200 shown in FIGS. 1 and 2. Each spot heater 170 includes the stage 194 disposed on the support 302. Each spot heater 170 may further include the collimator 190 disposed on the stage 194. One or more sensors 408, such as pyrometers, are disposed on the support 302. In some embodiments, each spot heater 170 includes the collimator 190 and the sensor 408, and both the collimator 190 and the sensor 408 are disposed on a single stage 194, as shown in FIG. 4B.

The one or more sensor 408 may be used to modulate power to the spot heater 170. For example, a controller (not shown) may receive temperature data from the sensors 408, and may increase or reduce power to the spot heater 170 based on the temperature data. In such a system, the combination of sensors 408 and spot heater 170 can be used in closed-loop or open-loop control to adjust the spot heater 170 based on a reading from the sensors 408.

Embodiments described herein can be used to tune spot heating of a substrate by adjusting the shape and/or size of a spot of heating radiation. The spot heater 170 is configured to control the shape and/or size of the beam spot dynamically without modifying the optics of the system.

Figure 5A:
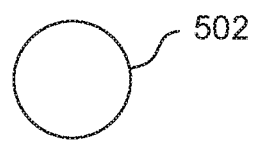
FIGS. 5A-5C are schematic views of a beam spot formed by one or more spot heaters of FIG. 3.
Figure 5B:
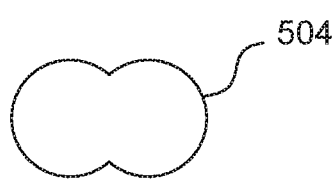
Figure 5C:
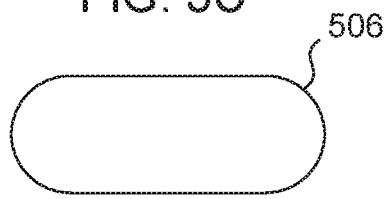

FIGS. 5A-5C are schematic views of a beam spot formed by one or more spot heaters 170 described herein. As shown in FIG. 5A, a beam spot 502 is formed by one spot heater 170 (FIG. 3). The beam spot 502 can be modified without making changes to the optics of the spot heater 170. For example, as shown in FIG. 5B, a beam spot 504 is formed by two spot heaters 170 (FIG. 1). The two spot heaters 170 are positioned so the beam spots produced by the spot heaters 170 overlap. The two spot heaters 170 may include electromagnetic radiant sources 103 that produce radiant beams at the same or different wavelengths. In one embodiment, the two spot heaters 170 include a blue laser and a green laser, respectively, and the beam spot 504 includes a blue portion and a green portion. Alternately, the beam spot 504 can be formed by moving the collimator 190 (FIG. 3). In another embodiment, the beam spot 504 is formed by actuating, for example vibrating, the slider 198 (FIG. 3). In yet another embodiment, the beam spot 504 is formed by actuating, for example moving, the angle A of the wedge 196 (FIG. 3). The moving of the collimator 190, the slider 198 or the angle A of the wedge 196 form a racetrack shaped beam spot 506, as shown in FIG. 5C. In one embodiment, a pair of wedges 196 is precisely machined with an offset angle to achieve the beam spots 504, 506, shown in FIGS. 5B, 5C, respectively.

Figure 6A:
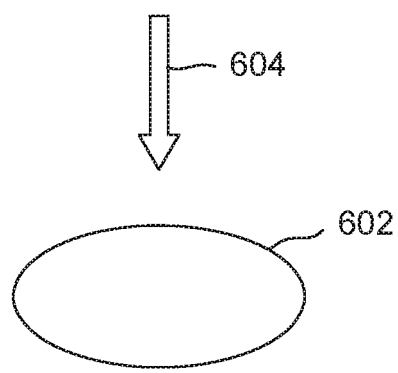
FIGS. 6A-6B are schematic views of a beam spot having different orientations with respect to the movement of a substrate according to one embodiment.
Figure 6B:
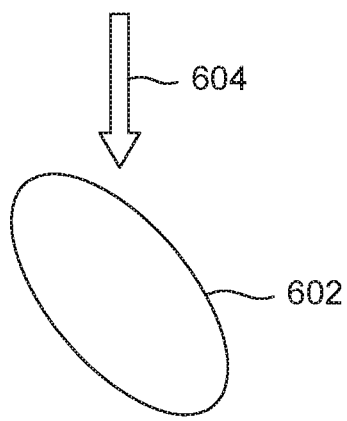

FIGS. 6A-6B are schematic views of a beam spot having different orientations with respect to the movement of a substrate according to one embodiment. As shown in FIG. 6A, a beam spot 602 has a shape of an ellipse. The major axis of the ellipse shaped beam spot 602 can be oriented substantially perpendicular to the direction of substrate movement, as indicated by arrow 604. When the major axis of the beam spot 602 is substantially perpendicular to the direction of the movement of the substrate, the width of the beam spot 602 (i.e. the effective length of the major axis of the beam spot 602) can be adjusted without making changes to the optics of the spot heater 170. For example, the width of the beam spot 602 can be changed by rotating the collimator 190 (FIG. 3). As shown in FIG. 6B, rotating of the collimator 190 causes the beam spot 602 orientation to rotate such that the major axis of the ellipse shaped beam spot 602 is no longer substantially perpendicular to the direction of the movement of the substrate, leading to a narrower width of the beam spot 602. This technique also works for linear beam spots.

Figure 7:
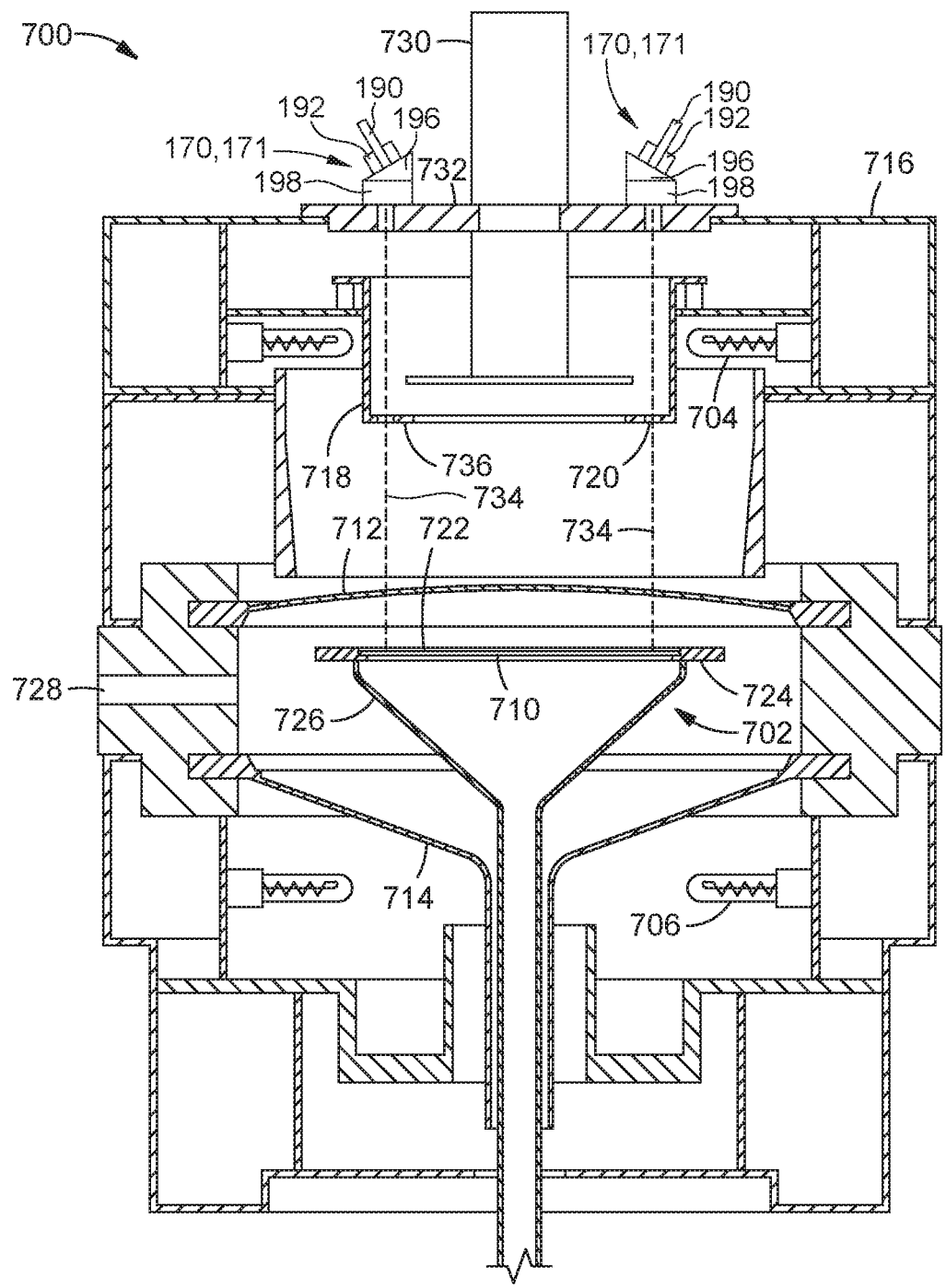
FIG. 7 is a schematic cross sectional side view of a process chamber according to another embodiment.

FIG. 7 is a schematic cross sectional side view of a process chamber 700 according to one embodiment. The process chamber 700 is similar in some respects to the process chamber 100 shown in FIGS. 1 and 2. The process chamber 700 is configured to process one or more substrates, including the deposition of a material on a device side 722 of a substrate 710. The process chamber 700 includes a first shell 712, a second shell 714, and a substrate support 702 disposed between the first shell 712 and the second shell 714. The first shell 712 and the second shell 714 may be fabricated from the same material as the first shell 108 and the second shell 110 shown in FIG. 1.

The substrate support 702 includes a support ring 724 for supporting the substrate 710 and a ring support 726 for supporting the support ring 724. The substrate 710 is transferred into the process chamber 700 through a loading port 728 and positioned on the support ring 724. The support ring 724 may be made of SiC coated graphite. The ring support 726 is rotated by a motor (not shown), which in turn rotates the support ring 724 and the substrate 710.

The process chamber 700 includes a first energy module 706, such as radiant heating lamps, disposed below the second shell 714 for heating the substrate 710 from below the substrate 710. The process chamber 700 also includes a second energy module 704, such as radiant heating lamps, disposed over the first shell 712 for heating the substrate 710 from above the substrate 710. In one embodiment, the first and second energy modules 704, 706 provide infrared radiant heat to the substrate though the first shell 712 and the second shell 714, respectively. The first and second shells 712, 714 are transparent to the radiation of the radiant energy emitted from the energy modules 704, 706 (transmitting at least 95% of the radiation of the radiant energy). In one embodiment, the process chamber 700 also includes one or more temperature sensors 730, such as optical pyrometers, which are used to measure temperatures within the process chamber 700 and on the device side 722 of the substrate 710. The one or more temperature sensors 730 are disposed on a support member 732 that is disposed on a cover 716. A reflector 718 is placed outside the first shell 712 to reflect infrared light radiating from the substrate 710 and the first shell 712 back towards the substrate 710.

A spot heating module 171 is disposed on the support member 732. The spot heating module 171 includes one or more spot heaters 170. Each spot heating module 171 produces one or more electromagnetic radiant beams 734, such as high-energy electromagnetic radiant beams, for example laser beams, each beam forming, or contributing to, a beam spot on the device side 722 of the substrate 710 in order to perform localized heating of the substrate 710. Where the spot heating module 171 is located above the reflector 718, the electromagnetic radiant beams 734 pass through an opening 720 formed in an annular portion 736 of the reflector 718, and the first shell 712, which is transparent to the radiation of the electromagnetic radiant beam 734 (transmitting at least 95% of the received radiation of the radiant beam 734).

During an epitaxy operation performed in the chamber 700, the substrate 710 is heated to a predetermined temperature, such as less than about 750 degrees Celsius. To improve the temperature uniformity of the substrate, the spot heating module 171 is used to locally heat one or more regions on the substrate 710. Since the substrate 710 is rotating during operation, the localized heating by the spot heating module 171 may occur be over an annular region at a certain radius of the substrate 710.

The temperature sensor 730 may be used to modulate power to the spot heating module 171. For example, a controller (not shown) may receive temperature data from the temperature sensor 730, and may increase or reduce power to the spot heating module 171 based on the temperature data. In such a system, the combination of temperature sensor 730 and spot heating module 171 can be used in closed-loop or open-loop control to adjust the spot heating module 171 based on a reading from the temperature sensor 730.

Figure 8:
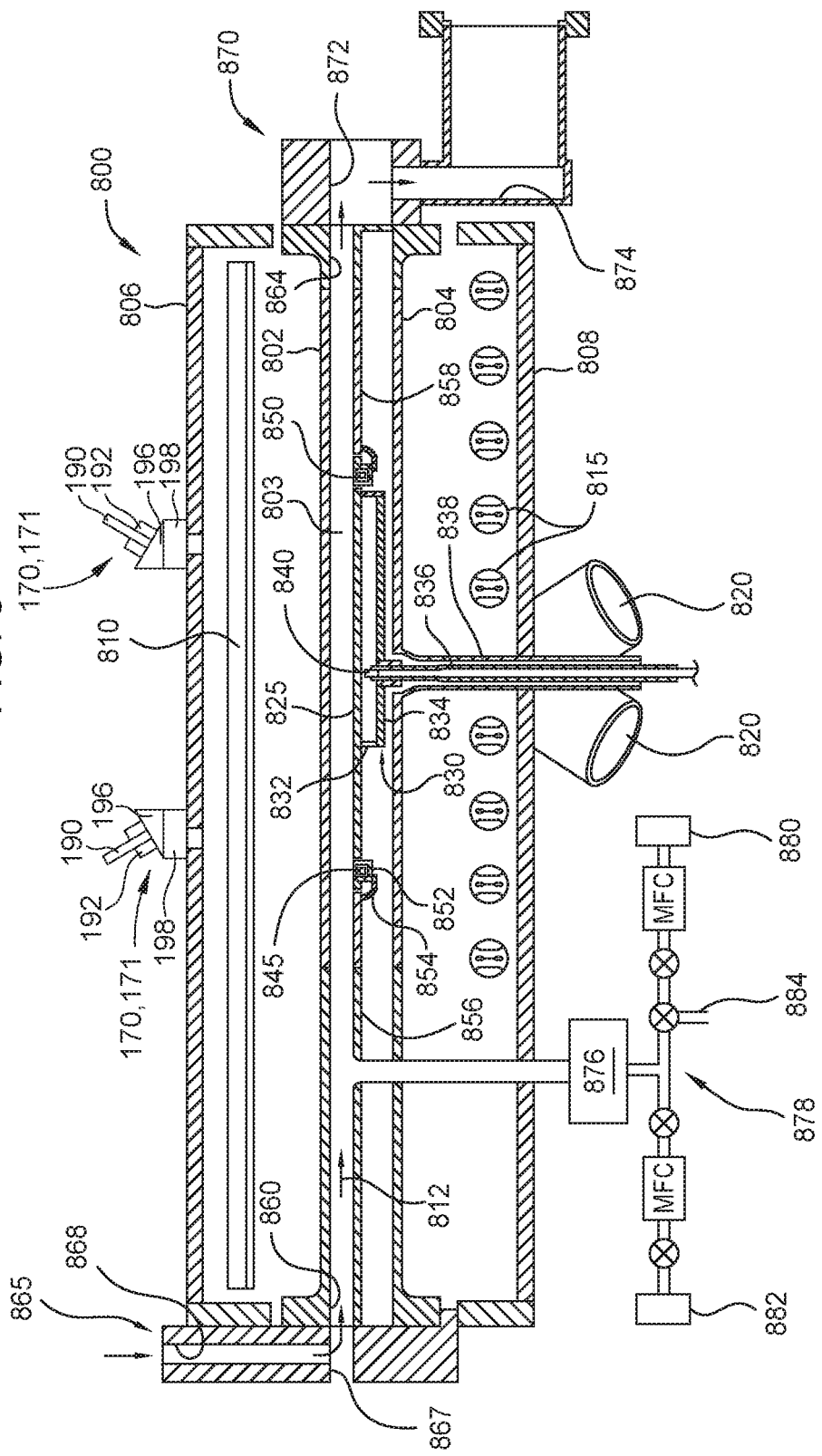
FIG. 8 is a schematic cross sectional side view of a process chamber according to yet another embodiment.

FIG. 8 is a schematic cross sectional side view of a process chamber 800 according to another embodiment. The process chamber 800 is similar in some respects to the process chamber 100 shown in FIG. 1. The process chamber 800 may generally have the shape of a rectangular box. The process chamber 800 includes a first shell 802, a second shell 804, and a region 803 defined by the first and second shells 802, 804. The first shell 802 and the second shell 804 may be fabricated from the same material as the first shell 108 and the second shell 110 shown in FIG. 1. In the embodiment of FIG. 8, the first and second shells 802 and 804 are flat, and made of quartz transparent to the wavelength of energy to be passed therethrough to heat a substrate.

A first energy module 810 is disposed over the first shell 802. The first energy module 810 may be a plurality of radiant heat sources, such as elongated tube-type radiant heating elements. The energy module 810 is disposed in spaced-apart parallel relationship and also extend substantially parallel to a reactant gas flow path (shown by arrow 812) through the process chamber 800. A second energy module 815 is positioned below the second shell 804, and oriented transverse to the first energy module 810. A plurality of spot heat sources 820 supply concentrated heat to the underside of the substrate support structure (described below), to counteract a heat sink effect created by cold support structures extending through the bottom of the process chamber 800.

A spot heating module 171 is disposed on a cover 806 located over the first energy module 810. The spot heating module 171 includes one or more spot heaters 170. The spot heating module 171 produces one or more electromagnetic radiant beams to perform localized heating of a substrate disposed in the process chamber 800. As is known in the art of semiconductor processing equipment, the power of the various heat sources 170, 810, 815, 820 can be controlled independently or in grouped zones in response to the substrate temperature measured through temperature sensors.

A substrate 825 is shown supported by a substrate support 830 disposed in the region 803. The substrate support 830 includes a substrate holder 832, upon which the substrate 825 rests, and a support spider 834. The spider 834 is mounted to a shaft 836, which extends downwardly through a tube 838 extending through a chamber bottom 808. The tube 838 communicates with a source of purge gas which can flow therethrough during processing of the substrate 825.

A plurality of temperature sensors is positioned in proximity to the substrate 825. The temperature sensors may take a variety of forms, such as optical pyrometers or thermocouples. In the illustrated embodiment, the temperature sensors comprise thermocouples, including a first or central thermocouple 840, suspended below the substrate holder 832 in any suitable fashion. The central thermocouple 840 passes through the spider 834 in proximity to the substrate holder 832. The process chamber 800 further includes a plurality of secondary or peripheral thermocouples, also in proximity to the substrate 825, including a leading edge or front thermocouple 845, a trailing edge or rear thermocouple 850, and a side thermocouple (not shown). Each of the peripheral thermocouples is housed within a slip ring 852, which surrounds the substrate holder 832 and the substrate 825. The slip ring 852 rests upon support members 854, which extend from a front chamber divider 856 and a rear chamber divider 858. The dividers 856, 858 are fabricated from quartz. Each of the central and peripheral thermocouples are connected to a temperature controller, which sets the power of the various heat sources 810, 815, 820 in response to the temperature readings from the thermocouples.

The process chamber 800 further includes an inlet port 860 for the injection of reactant and carrier gases, and the substrate 825 can also be received therethrough. An outlet port 864 is on the opposite side of the process chamber 800, with the substrate support structure 830 positioned between the inlet 860 and outlet 864. An inlet component 865 is fitted to the process chamber 800, adapted to surround the inlet port 860, and includes a horizontally elongated slot 867 through which the substrate 825 can be inserted. A generally vertical inlet 868 receives gases from gas sources and communicates such gases with the slot 867 and the inlet port 860. An outlet component 870 similarly mounts to the process chamber 800 such that an exhaust opening 872 aligns with the outlet port 864 and leads to exhaust conduits 874. The conduits 874, in turn, can communicate with suitable vacuum means (not shown) for exhausting process gases from the process chamber 800.

The process chamber 800 also includes a source 876 of excited species, positioned below the chamber bottom 808. The excited species source 876 may be a remote plasma generator disposed along a gas line 878. A source of precursor gases 880 is coupled to the gas line 878 for introduction into the excited species source 876. A source of carrier gas 882 is also coupled to the gas line 878. One or more branch lines 884 can also be provided for additional reactants. The excited species source 876 can be employed for plasma enhanced deposition, but also may be utilized for exciting etchant gas species for cleaning the process chamber 800 of excess deposition material when no substrate is in the process chamber 800.

Figure 9:
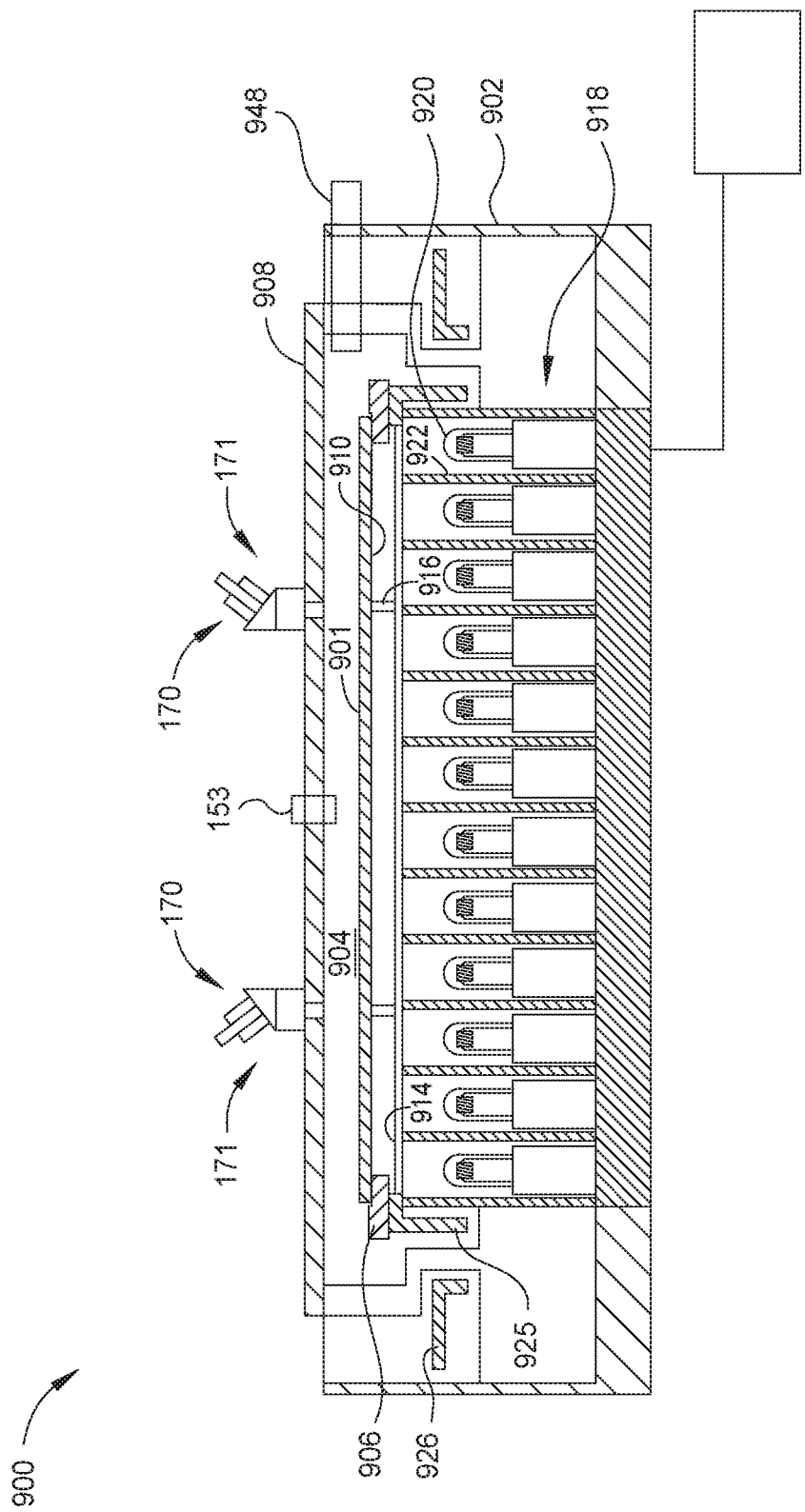
FIG. 9 is a schematic cross sectional side view of a process chamber according to a further embodiment.

FIG. 9 is a schematic cross sectional side view of a process chamber 900 according to yet another embodiment. The process chamber 900 includes the spot heating module 171. The process chamber 900 may be used to practice the method described herein. An exemplary process chamber 900 is the VULCAN® chamber, available from Applied Materials, Inc., of Santa Clara, Calif.

The process chamber 900 includes a chamber body 902. The chamber body 902 defines an interior volume 904 of the chamber 900. The process chamber 900 includes a substrate support 906 disposed in the interior volume 904. The substrate support 906 supports a substrate 901 on its periphery. In one embodiment, the substrate support 906 is positioned on a rotatable cylinder 925 that is magnetically coupled to a rotatable flange 926. The substrate 901 is oriented such that a surface 910 of the substrate 901 faces a transparent quartz window 914. Life pins 916 may be raised and lowered to support the substrate 901 when the substrate 901 is handed between a substrate handler bringing the substrate 901 into the process chamber 900 and onto the substrate support 906 via opening 948.

The process chamber 900 further includes a radiant heating apparatus 918 positioned below the window 914. The radiant heating apparatus 918 directs radiant energy towards the substrate 901 to heat the substrate 901. The radiant heating apparatus 918 includes a plurality of lamps 920 positioned in reflective tubes 922 arranged in a close-packed arrangement.

A spot heating module 171 is disposed on a cover 908 located over the substrate support 906. The spot heating module 171 includes one or more spot heaters 170. The spot heating module 171 produces one or more electromagnetic radiant beams to perform localized heating of the substrate 901 disposed in the process chamber 900. As is known in the art of semiconductor processing equipment, the power of the various heat sources 170, 918 can be controlled independently or in grouped zones in response to the substrate temperature measured through temperature sensors, such as one or more thermal sensors 153.

Embodiments described herein provide a processing chamber which includes a spot heating module for providing localized heating of a substrate during processing. Energy may be focused to a specific location during substrate rotation within the chamber in order to locally heat and tune specific locations of the substrate, such as locations adjacent to a lift pin, at specifically timed intervals. In some cases, the spot heating elements can be targeted to specific locations by measuring deposition thickness profile of a test substrate, finding locations of the test substrate that would have benefitted from spot heating, marking those locations on the test substrate, re-inserting the test substrate into the chamber, and using the targeting functionality (guide beam and positioning adjustments) described herein to direct the spot heating to the marked locations. Subsequent substrates can then be spot heated by the targeted spot heating elements to address systematic processing non-uniformities. The beam spot produced by the spot heating module can be modified without changing the optics of the spot heating module.

While the foregoing is directed to embodiments of the present disclosure, other and further embodiments of the disclosure may be devised without departing from the basic scope thereof, and the scope thereof is determined by the claims that follow.

The invention claimed is:

1. A process chamber, comprising:
   an enclosure;
   a substrate support disposed within the enclosure;
   an energy module disposed outside the enclosure facing the substrate support;
   a support disposed outside the enclosure; and
   a spot heating module disposed on the support, wherein the spot heating module comprises:
   a holder; and
   a movement device coupled to the holder, wherein the movement device rotates a collimator about an axis.

2. The process chamber of claim 1, further comprising a pulsing or continuous wave electromagnetic radiant source connected to the spot heating module.

3. The process chamber of claim 1, wherein the movement device is a controlled motion device.

4. The process chamber of claim 1, wherein the energy module comprises a plurality of heating lamps.

5. The process chamber of claim 4, wherein the spot heating module further comprises an electromagnetic radiant source.

6. The process chamber of claim 5, wherein the electromagnetic radiant source comprises a laser.

7. A process chamber, comprising:
   an enclosure;
   a substrate support disposed within the enclosure;
   an energy module disposed outside the enclosure facing the substrate support; and
   a spot heating module disposed outside the enclosure, wherein the spot heating module comprises:
   a plurality of holders; and
   a plurality of movement devices, wherein each movement device of the plurality of movement devices is coupled to a corresponding holder of the plurality of holders, wherein each movement device of the plurality of movement devices rotates a respective collimator of a plurality of collimators around a longitudinal axis of the respective collimator.

8. The process chamber of claim 7, further comprising a pulsing or continuous wave electromagnetic radiant source connected to the spot heating module.

9. The process chamber of claim 7, wherein each movement device of the plurality of movement devices is a controlled motion device.

10. The process chamber of claim 7, wherein the energy module comprises a plurality of heating lamps.

11. The process chamber of claim 10, wherein the spot heating module further comprises an electromagnetic radiant source.

12. The process chamber of claim 11, wherein the electromagnetic radiant source comprises a laser.

13. A process chamber, comprising:
an enclosure;
a substrate support disposed within the enclosure;
an energy module disposed outside the enclosure facing the substrate support; and
a spot heating module disposed outside the enclosure, wherein the spot heating module comprises:
a stage;
a holder disposed on the stage;
a collimator disposed in the holder; and
a movement device disposed between the holder and the collimator,
wherein the movement device rotates the collimator about a longitudinal axis of the collimator.

14. The process chamber of claim 13, further comprising a thermal sensor disposed on the stage.

15. The process chamber of claim 13, further comprising a slider disposed on the stage.

16. The process chamber of claim 13, further comprising a reflector, wherein the stage is disposed on the reflector.

17. The process chamber of claim 13, wherein the movement device is a controlled motion device.

18. The process chamber of claim 13, wherein the energy module comprises a plurality of heating lamps.

19. The process chamber of claim 18, wherein the spot heating module further comprises a laser.

20. A process chamber, comprising:
an enclosure;
a substrate support disposed within the enclosure;
an energy module disposed outside the enclosure facing the substrate support; and
a spot heating module disposed outside the enclosure, wherein the spot heating module comprises:
a stage;
a holder disposed on the stage;
a collimator disposed in the holder;
a movement device disposed between the holder and the collimator;
a slider disposed on the stage; and
a wedge disposed on the slider, wherein the collimator and the holder are disposed on the wedge.

* * * * *